United States Patent
Afsahi et al.

(10) Patent No.: US 10,003,303 B2
(45) Date of Patent: Jun. 19, 2018

(54) MODULATED SUPPLY AMPLIFIER WITH ADJUSTABLE INPUT PARAMETER CONFIGURATION

(71) Applicant: Avago Technologies General IP (Singapore) Pte. Ltd., Singapore (SG)

(72) Inventors: Ali Afsahi, San Diego, CA (US); Debopriyo Chowdhury, San Diego, CA (US); Rethnakaran Pulikkoonattu, San Diego, CA (US); Sraavan Reddy Mundlapudi, San Diego, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days. days.

(21) Appl. No.: 15/180,840

(22) Filed: Jun. 13, 2016

(65) Prior Publication Data
US 2017/0279412 A1    Sep. 28, 2017

Related U.S. Application Data

(60) Provisional application No. 62/311,909, filed on Mar. 22, 2016.

(51) Int. Cl.
| | |
|---|---|
| H03F 3/04 | (2006.01) |
| H03F 1/02 | (2006.01) |
| H03F 1/32 | (2006.01) |
| H03F 3/193 | (2006.01) |
| H03F 3/213 | (2006.01) |
| H03F 1/22 | (2006.01) |

(52) U.S. Cl.
CPC ......... *H03F 1/0222* (2013.01); *H03F 1/3241* (2013.01); *H03F 3/193* (2013.01); *H03F 3/213* (2013.01); *H03F 1/0211* (2013.01); *H03F 1/0244* (2013.01); *H03F 1/0277* (2013.01); *H03F 1/22* (2013.01); *H03F 1/223* (2013.01); *H03F 2200/102* (2013.01); *H03F 2200/18* (2013.01); *H03F 2200/451* (2013.01); *H03F 2201/3233* (2013.01)

(58) Field of Classification Search
CPC ...................................................... H03F 1/0222
USPC ................................. 330/127, 136, 296, 311
See application file for complete search history.

(56) References Cited

U.S. PATENT DOCUMENTS

| | | | | |
|---|---|---|---|---|
| 8,064,852 | B2 * | 11/2011 | Pennec | H03F 1/0261 455/114.1 |
| 2015/0171796 | A1 * | 6/2015 | Matsui | H03F 1/0222 330/296 |

* cited by examiner

*Primary Examiner* — Khanh V Nguyen
*Assistant Examiner* — Khiem Nguyen
(74) *Attorney, Agent, or Firm* — Foley & Lardner LLP

(57) ABSTRACT

An amplifier may include control circuitry that may track a first input signal parameter and, in response, adjust a value of a second input parameter. Input parameter tracking and adjustment may facilitate control of output parameters for the amplifier. For example, an envelope-tracking amplifier may track input signal amplitude and adjust other input parameters in response. The adjustments may facilitate control of output parameters, such as gain or efficiency. The amplifier may further include calibration circuitry to determine adjustment responses to various tracked input parameters.

20 Claims, 16 Drawing Sheets

MODULATED SUPPLY AMPLIFIER WITH ADJUSTABLE INPUT PARAMETER CONFIGURATION

PRIORITY CLAIM

This application claims priority to provisional application Ser. No. 62/311,909, filed Mar. 22, 2016, which is entirely incorporated by reference.

TECHNICAL FIELD

This disclosure relates to modulated supply amplifiers. This disclosure also relates to amplifiers that handle time-varying input signals.

BACKGROUND

Rapid advances in electronics and communication technologies, driven by immense customer demand, have resulted in the widespread adoption of mobile communication devices. Many of these devices, for example, smartphones, laptops, tablets, have sophisticated signal processing capabilities. These devices may rely on power amplifiers to adjust signal levels and facilitate operation. In many such devices, energy consumption is of interest, and reduced energy consumption is often a design goal.

DETAILED DESCRIPTION

Figure 1:
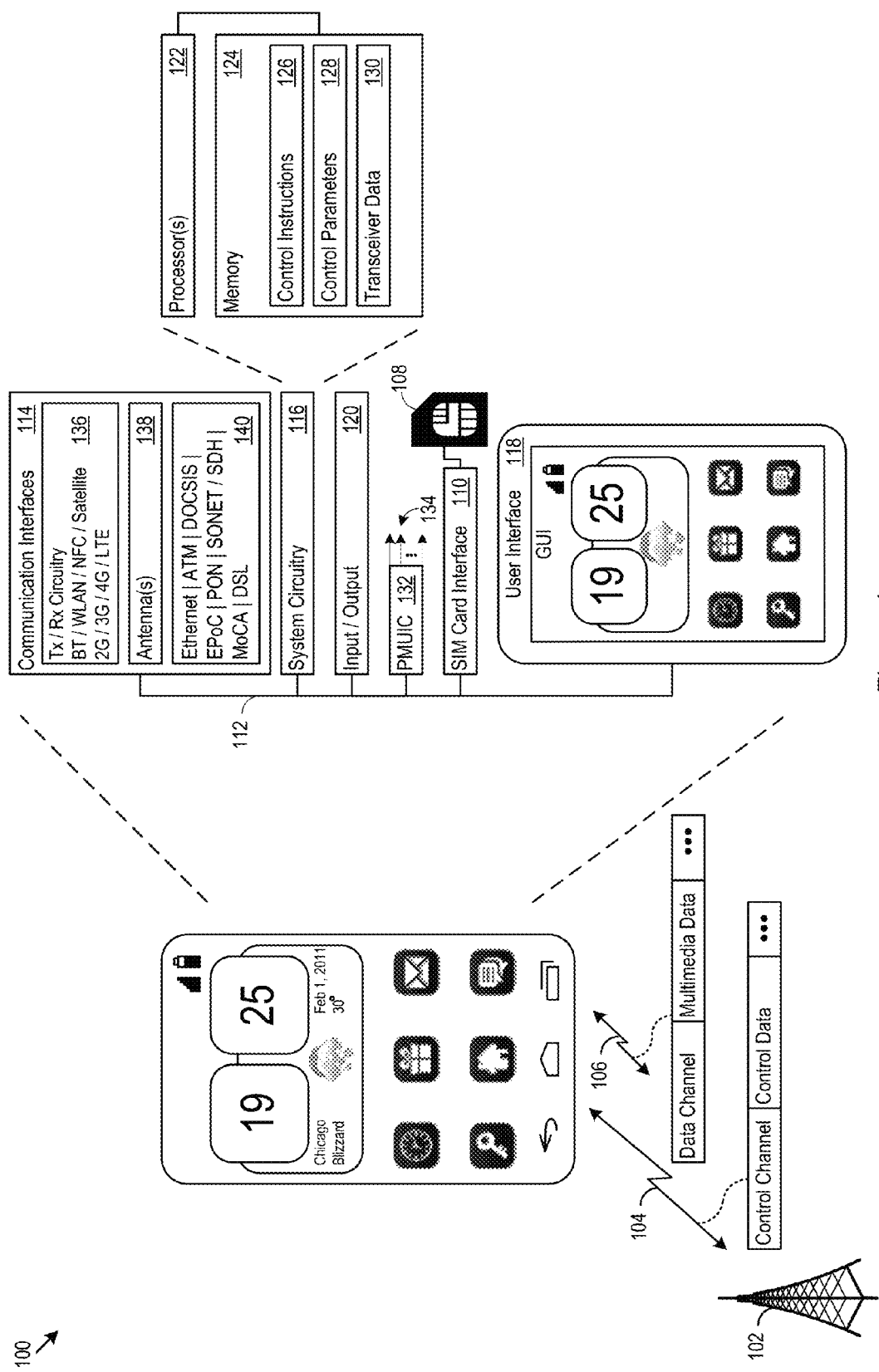
FIG. 1 shows an example of user equipment.

During signal processing, for example, for signal transmission, reception, analysis, or other processing, signals may be amplified. Power amplifiers, low-noise amplifiers, and other amplifier types may consume energy during operation. In some cases, the efficiency of an amplifier may be increased by tailoring the amplifier's operation such that the amplifier may operate with first input parameters when producing a peak or otherwise high output and operate with second input parameters when producing an average output or low output. Allowing flexibility during active operation of the amplifier may allow for increases in amplification efficiency relative to operation with fixed input parameters. Amplifier circuitry may operate with time-varying power supply inputs, such as those from a modulated supply (MS) or time-varying input signals.

Supply modulation is a technique that may be used in power amplifier (PA) design to control the efficiency of the PA. In a supply modulated PA, the supply voltage (VDD) of the PA, may be varied according to a chosen parameter, for example, the output power delivered by the PA or the input signal level provided to the PA. In an example scenario, when the PA delivers peak output power, the maximum supply voltage may used, while the supply voltage may be reduced if the power amplifier is not transmitting at its peak.

Supply modulation may be static or dynamic. Average power tracking is a technique in which the MS voltage of the PA may be changed statically responsive to the transmitted power of the system. In such a system, the PA VDD may be constant within a given frame of transmission, but two successive frames having different average transmit powers may employ different MS voltages.

For example, in an envelope-tracking (ET) amplifier, such as an ET power amplifier, ET information indicative of an input signal envelope may be used to select input parameters, such as power supply characteristics, for operation of the amplifier. In various implementations, ET information may include, for example, a signal intensity profile generated by a baseband processor in advance of signal transmission, an analog input signal intensity profile, input signal pre-amplification, a sampled signal amplitude, or other indicators of time-varying input signal intensity. Thus, an ET amplifier may have both time-varying input signals and time varying power supply inputs.

In some ET implementations, the supply voltage of the power amplifier (PA) may be varied dynamically according to the envelope of a radio frequency (RF) signal. Some communication systems use signals with high peak-to-average power (PAPR) ratios that may affect transmission efficiency in systems using unmodulated power supplies. For example, WiFi-based wireless local area networks (WLANs) may employ orthogonal frequency division multiplexing (OFDM) signaling for multi-path mitigation, which may result in high PAPR. In some cases, the PA may operate in a backed-off zone, which is lower than its maximum operating power (Psat). Because the PA is not necessarily delivering its peak output power for portions of the transmitted packet, the supply voltage of the PA can also be reduced at those times and increased when the peak powers are transmitted.

Other example MSs may include: unregulated power sources, such as unregulated batteries, which may vary in output in response to the charge state of the battery; manually reconfigurable static power supplies, or other power supplies in which the supply output level may vary with time.

Control circuitry of the MS amplifier may adjust input or operational parameters, either individually or in parallel with one another, including power supply voltages, power supply current, gate voltage for cascode transistors, input signal pre-amplification, or other input or operational parameters of the MS amplifier.

In addition, the pattern that the adjustments follow as the input signal envelope changes may be calibrated and stored, for example, in a look-up table. In some implementations, the calibration procedure may include varying the value of one or more input parameters while recoding the value of an output parameter. For example, output parameters may include gain, amplifier efficiency, amplifier power consumption, or other output parameters. After recording the output parameter values and corresponding input parameters, the calibration circuitry may search among the recorded output parameter values for values that match a predetermined criterion. For example, an output value criterion may be a stored criterion such as a threshold output parameter value, a target output parameter value, a deviation threshold from a target output value, a value range, a function of one or more input or output parameters, or other criteria. Once criterion-matching output values are found by the calibration circuitry, the calibration circuitry may select the corresponding input values that generated the criterion-matching output values to control operation of the amplifier.

In various implementations, the MS amplifier may operate as a MS power amplifier within user equipment such as a mobile device. FIG. 1 shows an example of user equipment 100 ("UE 100"). The UE 100 is a smartphone in this example, but the UE 100 may be any electronic device. The techniques and architectures described below regarding time-varying input signal dependent operation of amplifiers may be applied to any device implementing an amplifier handling time-varying input signals, for example input signals with a time-varying amplitude envelope. Accordingly, the particular UE 100 described below provides just one example context for explaining the amplifier operation techniques.

The UE 100 may be a 2G, 3G, or 4G/LTE smartphone capable of making and receiving wireless phone calls, and transmitting and receiving data of any type over 3G/4G LTE, 802.11 a/b/g/n/ac/ad ("WiFi"), Bluetooth (BT), near field communications (NFC), or any other type of wireless technology. The UE 100 may also, in addition to making and receiving phone calls, run any number or type of applications.

FIG. 1 shows the UE 100 in communication with a network controller 102, such as an enhanced Node B (eNB) or other base station. The network controller 102 and UE 100 may establish communication channels such as the control channel 104 and the data channel 106, and exchange data. In this example, the UE 100 may support one or more subscriber identity modules (SIMs), such as the SIM 108. Electrical and physical interfaces 110 connect the SIM 108 to the other hardware in the UE 100, for example, over the system bus 112.

The UE 100 may include communication interfaces 114, system logic 116, and a user interface 118. The system circuitry 116 may include any combination of hardware, software, firmware, or other circuitry. The system circuitry 116 may be implemented, for example, with one or more systems on a chip (SoC), application specific integrated circuits (ASIC), discrete analog and digital circuits, and other circuitry. The system circuitry 116 is part of the implementation of any desired functionality in the UE 100. In that regard, the system circuitry 116 may include logic that facilitates, as examples, decoding and playing music and video, for example, MP3, MP4, MPEG, AVI, FLAC, AC3, or WAV decoding and playback; running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118.

The user interface 118 and the input/output (I/O) interfaces 120 may include a graphical user interface, touch sensitive display, voice or facial recognition inputs, buttons, switches, speakers and other user interface elements. Additional examples of the I/O interfaces 120 include microphones, video and still image cameras, temperature sensors, vibration sensors, rotation and orientation sensors, acceleration sensors, headset and microphone input/output jacks, universal serial bus (USB), serial advanced technology attachment (SATA), and peripheral component interconnect express (PCIe) interfaces and connectors, memory card slots, radiation sensors (for example, infrared (IR) or radio frequency (RF) sensors), and other types of inputs. The I/O interfaces 120 may further include audio outputs, magnetic or optical media interfaces (for example, a CDROM or DVD drive) or other types of serial, parallel, or network data interfaces.

The system circuitry 116 may include one or more processors 122 and memories 124. The memory 124 stores, for example, control instructions 126 that the processor 122 executes to carry out desired functionality for the UE 100. The control parameters 128 provide and specify configuration and operating options for the control instructions 126. For instance, the control instructions 126 and control parameters 128 may implement RRM as described below. The memory 124 may also store any BT, WiFi, cellular, or other transceiver data 130 that the UE 100 will send, or has received, through the communication interfaces 114.

The UE 100 may include a power management unit integrated circuit (PMUIC) 132. The PMUIC 132 generates power supply voltages for the hardware in the UE 100. In a complex device like a smartphone, the PMUIC 132 may be responsible for generating thirty (30) or more different power supply rails 134 for the circuitry in the UE 100.

In the communication interfaces 114, wireless transceiver circuitry 136, for example, radio frequency (RF) transmit (Tx) and receive (Rx) circuitry, performs transmission and reception of signals through one or more antennas 138. Accordingly, the wireless transceiver circuitry 136 may include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more of the antennas 138.

The communication interfaces 114 may also include physical medium transceiver circuitry 140. Examples of physical media include optical fiber, coaxial cable such as RG6, telephone lines, network (for example, Ethernet) cables, buses such as the PCIe bus, and serial and parallel cables. Accordingly, the physical medium transceiver circuitry 140 may include Tx and Rx circuits for communication according to, as examples, Ethernet, asynchronous transfer mode (ATM), data over cable service interface specification (DOCSIS), Ethernet passive optical network (EPON), EPON protocol over coax (EPoC), synchronous optical networking (SONET/SDH), multimedia over cable alliance (MoCA), digital subscriber line (DSL), over associated physical media. As such, the signals transmitted and received by the communication interfaces 114 may adhere to any of a diverse array of formats, protocols, modulations (for example, QPSK, 16-QAM, 64-QAM, or 256-QAM), frequency channels, bit rates, and encodings.

The transceiver circuitry 136, physical medium transceiver circuitry 140, system circuitry 116, or other circuitry in the UE 100 may include MS amplifiers, for example, MS power amplifiers, or other amplifiers that adjust to time-varying input signal parameters. Further, the transceiver circuitry 136, physical medium transceiver circuitry 140, system circuitry 116, or other system components may include calibration circuitry to control input parameter selection for the amplifiers.

Figure 2:
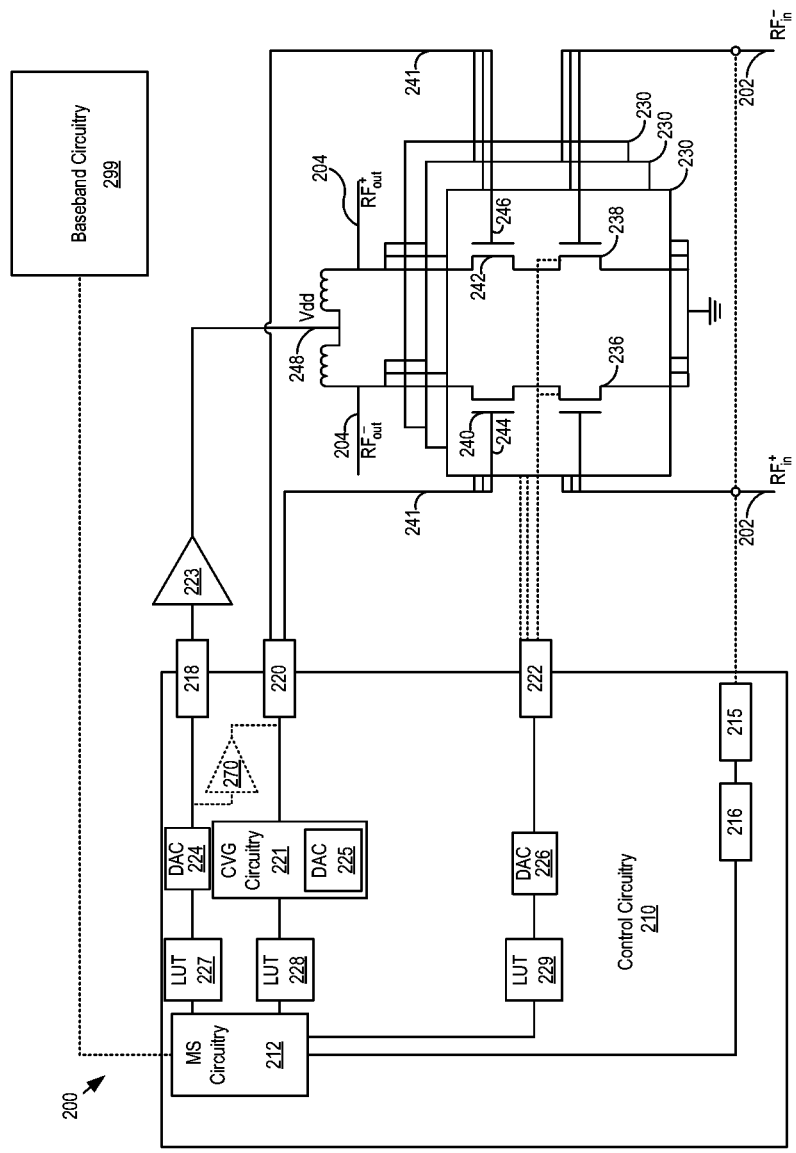
FIG. 2 shows example modulated supply (MS) amplifier circuitry.

Referring now to FIG. 2, example MS amplifier circuitry 200 is shown. The MS amplifier circuitry 200 may include, input 202, output 204, amplifier control circuitry 210, one or more amplifier fingers 230.

The control circuitry 210 may include MS circuitry 212. The control circuitry may include sensors 215, sampling circuitry 216, or other monitoring circuitry to obtain a characterization of the envelope of the input signal at input 202. For example, baseband circuitry 299, in communication with the MS circuitry 212, may characterize the input signal by sending an amplitude profile, for example, data indicating how the amplitude of the input signal changes over time, for an impending transmission. For example, an impending transmission may include a baseband coded data signal queued for transmission by the baseband circuitry 299. The MS circuitry 212 may then produce MS information based on the data received from the baseband circuitry 299. Additionally or alternatively, the MS circuitry may collect data from the sensors 215, sampling circuitry 216 and produce MS information based on the collected data. MS information may be produced based on virtually any information indicative of time varying parameters of the input signal at input 202.

The control circuitry 210 may further include control outputs 218, 220, 222, which may produce outputs to guide operation of the amplifier fingers 230. For example, output 218 may be a power supply output configured to provide a power supply voltage (Vdd) to the amplifier fingers 230. Output 220 may be a cascode control output configured to supply a bias voltage, for example, a differential bias voltage, to a gate terminal of one or more cascode transistors 240, 242 within the amplifier fingers 230. Output 222 may include providing switching signals to activate or deactivate individual amplifier fingers 230, such that a selected number of the amplifier fingers 230 may be active at a given time. For example, the switching signals may cause the radio frequency input (RFin) at 202, to be switched off or on for individual amplifier fingers 230. In some implementations, activation and deactivation may be executed during active operation of the amplifier fingers 230. For example, the number of active amplifier fingers 230 may be increased or decreased in accord with the time variance of the MS information.

Referring again to FIG. 2, the amplifier fingers 230 may comprise multiple parallel amplifier circuits. For example, each amplifier finger 230 may be a single amplifier circuit.

In the example MS amplifier circuitry 200, the amplifier fingers 230 may be characterized by a power amplifier design structure. However, other amplifier design structures may be implemented. For example, for a low noise amplifier (LNA) in reception circuitry, the amplifier fingers may be characterized by a LNA design structure. The LNA-design amplifier fingers may be activated or deactivated and supply modulated similarly to the power amplifier design show in the example MS amplifier circuitry 200. Similarly other design-type amplifiers may be used with the techniques and architectures discussed herein.

Referring now to the amplifier fingers 230 of FIG. 2, the amplifier fingers 230 may include a parallel-coupled amplifier input 204 and a parallel-coupled amplifier output 204. The individual amplifier fingers 230 may include amplifier transistors 236, 238 and cascode transistors 240, 242. The gates 244, 246 of the cascode transistors 240, 242 may be parallel-coupled, via the cascode gate input 241, to the cascode control output 220. The amplifier transistors 236, 238 may be coupled, for example, coupled directly or indirectly, to the finger control output 222 such that the control circuitry may individually and independently activate or deactivate the amplifier fingers.

In addition, the amplifier fingers may include a parallel coupled power supply input 248 which may receive a power supply voltage from output 218. The power supply voltage may vary responsive to the MS information to vary a magnitude of the supply voltage being provided to all of the amplifier fingers 230.

Referring to FIG. 2, by adjusting the active (or enabled) number of amplifier fingers 230, the control circuitry 210 may control the quiescent current of the amplifier fingers 230. For example, as the output power at output 204 increases due to increasing load, the amplifier fingers 230 may operate more efficiently with an increased number of active amplifier fingers 230 each supplying a portion of the load. However, increasing the active number of amplifier fingers may increase energy losses due to quiescent current under reduced or decreasing load conditions. When the output power decreases due to decreasing loading conditions, the efficiency gained from an increased number of active amplifier fingers during high load conditions may be reduced by quiescent current losses of the amplifier fingers 230 under reduced or no load conditions. The increased power losses due to quiescent current when more amplifier fingers 230 are active than may be needed to support the load conditions may overcome the efficiency gain of having multiple amplifier fingers active during increased loading conditions. Accordingly, when the output power at output 204 deceases, the control circuitry 210 may dynamically decrease the active number of amplifier fingers 230, thereby decreasing quiescent current losses. Conversely, as load increases, the control circuitry 210 may dynamically increase the active number of amplifier fingers 230 to supply power to the load.

The control circuitry 210 may also control the efficiency and linearity of the example MS amplifier circuitry 200, 300 by adjusting the cascode control voltage from the cascode control output 220. Adjusting the cascode control voltage, such as the gate voltages of cascode transistors 240, 242, may control the current and voltage supplied to amplifier transistors 236, 238. Thus, the linearity and efficiency of the amplifier transistors 236, 238 may be controlled via the cascode transistors 240, 242. Additionally or alternatively, the power supply voltage from output 218 may also be controlled. In some cases, the control outputs 218, 220 may be combined to form a single output. In such cases, a voltage derived from the MS information may be provided to the cascode gate inputs 244, 246 and the power supply input 248.

In some implementations, the relationship between the outputs 220 and 218 may be fixed. For example, the voltage at cascode control output 220 may be a scaled or offset voltage from output 218 where the scale and offset are predetermined and fixed. In the example of FIG. 2, an amplifier 270 is illustrated, which can provide a predetermined offset or scaling of the voltage of output 218. In other examples, other forms of scaling or offset are possible.

In some implementations, the control voltage at cascode control output 220 and the control voltage at output 218 may be generated in parallel but through separate at least partially independent processes that may both be dependent on the MS information. Accordingly, the relationship between the control voltages at outputs 220, 218 may vary how they relate to one another, but both voltages may be derived from the MS information.

In the example MS amplifier circuitry 200, the cascode control output 220 may be coupled to cascode voltage generation (CVG) circuitry 221. In some cases, the CVG circuitry 221 may include a digital-to-analog converter DAC circuitry 225, which may receive the MS information as input and generate the cascode control voltage(s) for the cascode control output 220. The power supply output 218 may be coupled to a power supply modulator 223 that provides an MS information dependent power supply voltage as the control voltage.

Additionally or alternatively, the CVG circuitry 221 may be coupled to look-up table (LUT) circuitry 227, 228, 229. The LUT circuitry 227, 228, 229 may include a memory for storing memory storing entries which may be indexed according the input parameter values. Thus, the received MS information may be used to select an entry, as described below, from the LUT circuitry 227, 228, 229 which may then be passed to the DAC circuitry for generation of the cascode control voltage for output 220. In some implementations, the power supply modulator 223 may be coupled to corresponding LUT circuitry 227, 228, 229. Accordingly, the LUT circuitry 227, 228, 229, coupled to the power supply modulator, may access a corresponding digital entry responsive to the MS information and pass the accessed value to the power supply modulator 223 for generation of the power supply voltage. A LUT may store entries to facilitate digital value look-ups for various input parameters. Hence, one or more LUTs may serve as cascode voltage LUTs, power supply voltage LUTs, active amplifier LUTs, or LUTs or other input parameters.

In some implementations, a LUT with multiple values in each entry may provide a first value to the DAC circuitry 225 of the CVG 221 and a second value to the power supply DAC 224. Additionally or alternatively, the LUT circuitry 227, 228, 229 may provide a signal indication to the finger control DAC 226 coupled to the finger control output 222 to select the number of amplifier fingers 230 to place in an active activity state. Accordingly, centralized LUT circuitry 227, 228, 229 may facilitate signal provision to the outputs 218, 220, 222 with a single look-up of multiple associated entries in place of three independent look-ups.

Using the outputs 218, 220, 222 the control circuitry 210 may control multiple input parameters for the amplifier fingers 230, such as, current flow, input impedance, supply voltage, cascode bias level, amplifier efficiency, amplifier linearity, or other input parameters. For example, the impedance imparted on input 202 by the active number of amplifier fingers may control the input impedance of the amplifier circuitry by controlling the number of transistors parallel-coupled to the input. Amplifier linearity may be affected by cascode bias as discussed above. Additionally or alternatively, linearity may be controlled by the number of active amplifier fingers. For example, the loading of each individual amplifier finger may be lower when more amplifier fingers are parallel coupled to the output. Accordingly, adding active amplifier fingers as loading increases (for example, as Vdd increases) may operate to hold individual fingers within a linear operating range. Further, increasing the number of active amplifier fingers may increase the output current flow for a given supply voltage due to reduced output impedance. The outputs 218, 220, 222 and accompanying circuitry illustrate the principle of input parameter control. However, the system may be adapted to control other input parameters such as input signal level, for example, by using pre-amplification stages. Further, the amplifier circuitry may be implemented such that any one or any combination of input parameters may be controlled. For example, another example amplifier circuit may only support cascode voltage control. Similarly, another example system may include support for MS voltage tracking and amplifier finger switching but use a fixed cascode bias level.

Figure 3:
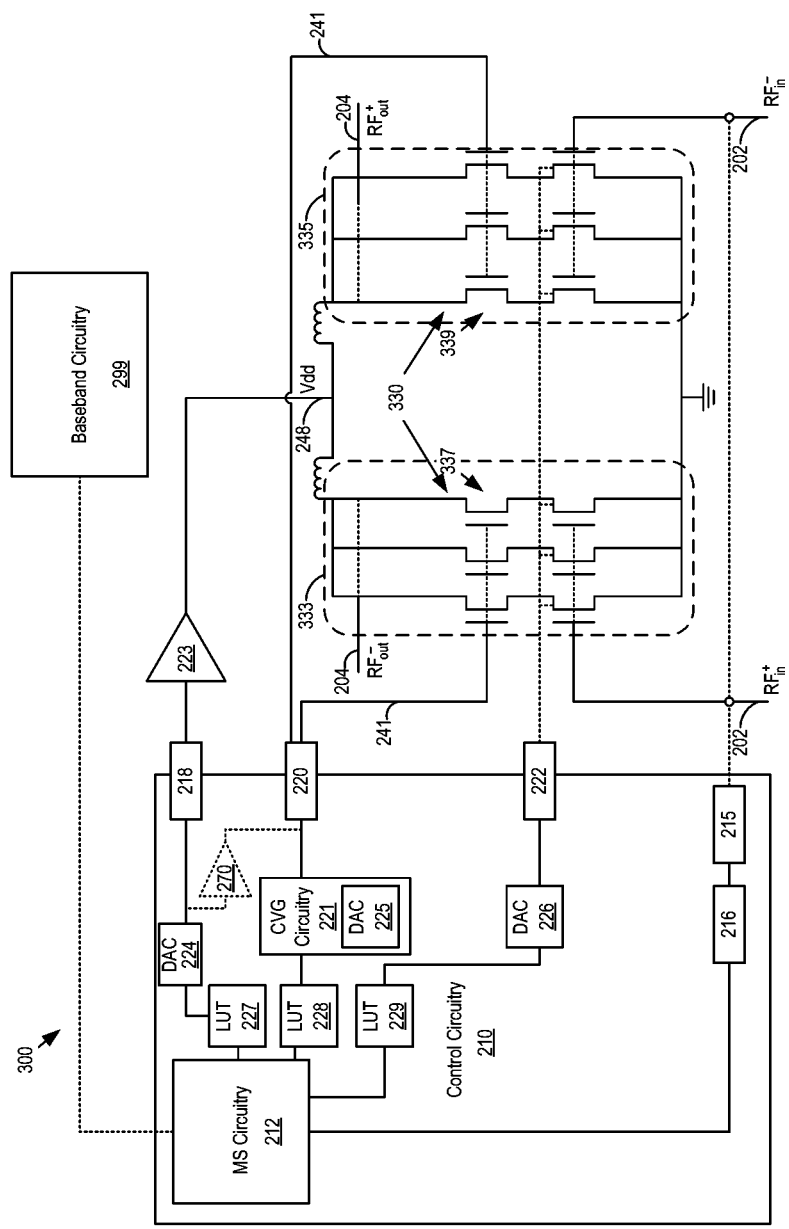
FIG. 3 shows example MS amplifier circuitry.

Referring now to FIG. 3, example amplifier circuitry 300 is shown. Example amplifier circuitry 300 includes amplifier fingers 330 in an amplifier branch layout. In the amplifier branch layout, the amplifier fingers 330 may be p-doped 333 and n-doped 335 branch sides. The operation of the example amplifier circuitry 300 may be similar to the example amplifier circuitry with a branch 337 from the p-doped side 333 and a branch 339 from the n-doped side 335 being activated or deactivated together. Functionally, activating or deactivating branches 337, 339 together may be similar to activating or deactivating an amplifier finger 230 of the example MS amplifier circuitry 200 of FIG. 2.

A MS power amplifier employing a supply voltage modulation scheme with branch modulation may be implemented in a cascode configuration. For example, integrated system implementations may use the cascode configuration. In some cases, to increase the efficiency or other desired output parameters, the cascode gate bias may be varied, for example, according to the envelope of the RF signal. However, in some cases, the optimum transfer function between signal envelope and cascode bias may not necessarily be a linear function. In some implementations, a digital LUT may be used together with a baseband digital-to-analog converter (DAC) to generate arbitrary modulation profiles for the cascode bias. In an example system-on-chip with integrated digital, analog and RF circuitry, the cascode modulation may be implemented using on-chip digital circuits and DACs to generate the cascode bias waveform.

Figure 12:
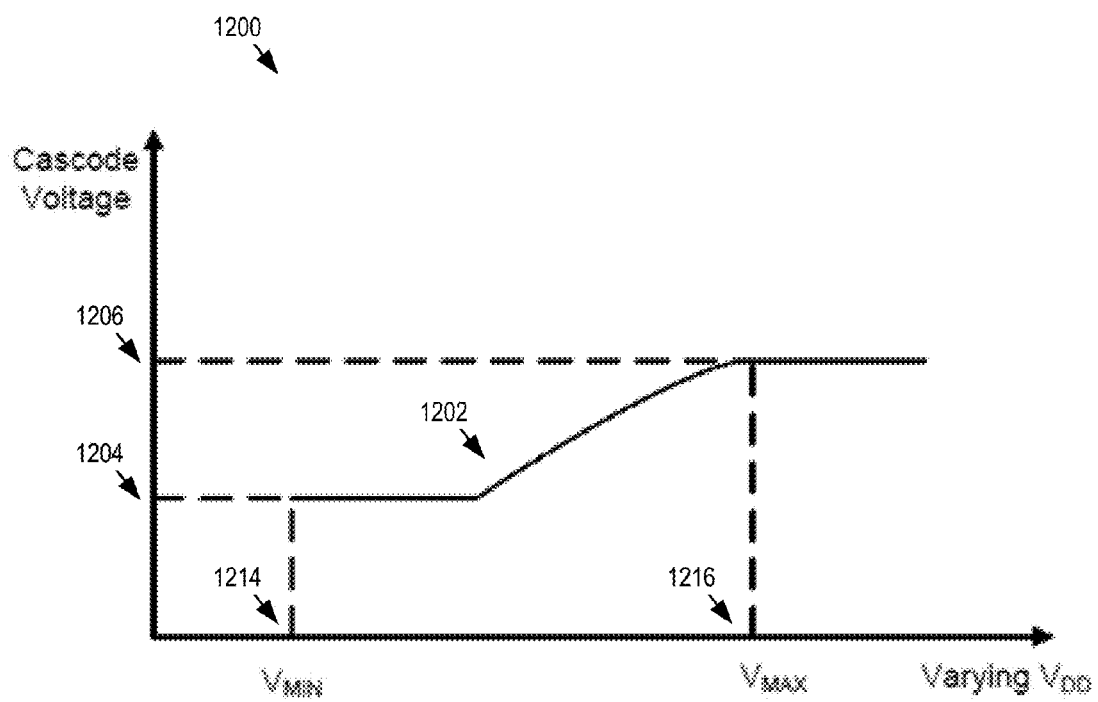
FIG. 12 shows a plot of an example cascode voltage waveform.

FIG. 12 shows a plot 1200 of an example cascode voltage waveform 1202. The example cascode voltage waveform varies from a minimum value 1204 to a maximum value 1206 in a piecewise non-linear function as the MS voltage varies from $V_{min}$ 1214 to $V_{max}$ 1216.

Figure 4:
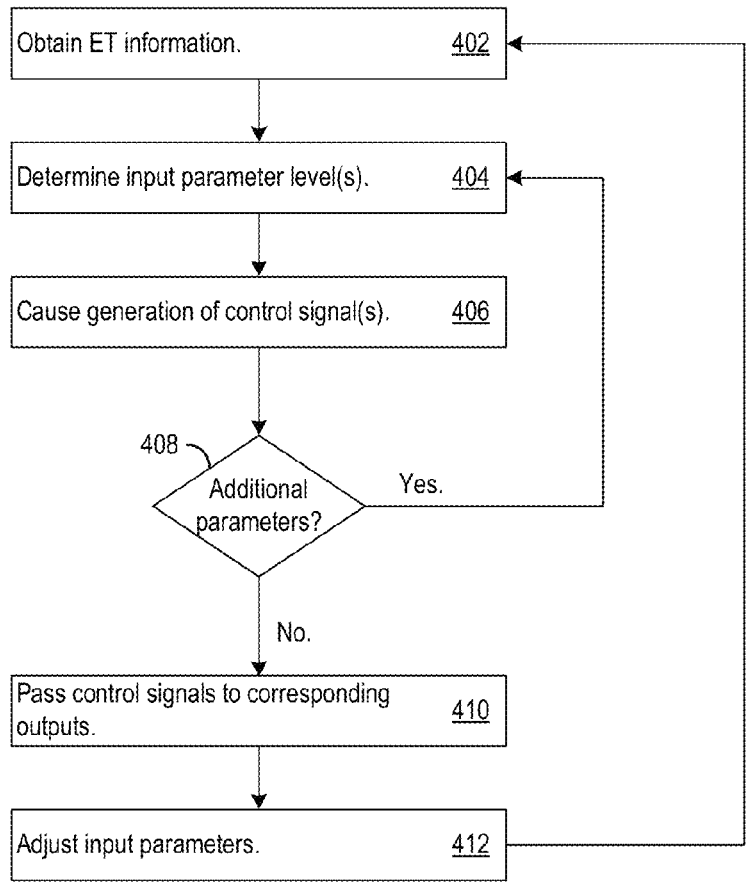
FIG. 4 shows example parameter tracking logic.

FIG. 4 shows an operational flow diagram of example parameter tracking logic (PTL) 400, which may be implemented on circuitry. The PTL 400 may obtain MS information (402). For example, the PTL 400 may receive MS information generated by baseband circuitry in anticipation of an outgoing signal transmission. Additionally or alternatively, the MS information may be provided by one or more sensors at the input 202 of the amplifier circuitry 200, 300. The PTL 400 may determine one or more input parameter levels responsive to the MS information (404). For example, the PTL 400 may cause the LUT circuitry to perform a look-up using the MS information. Once the input parameter level(s) have been determined, the PTL may cause generation of one or more control signals to facilitate control of the input parameter (406). When the PTL 400 controls multiple input parameters, the PTL 400 may perform actions 404, 406 for the multiple input parameters in parallel (408). For example, the PTL 400 may perform actions 404, 406 during the same time period for each of the controlled input parameters. However, the parallel actions 404, 406 need not necessarily be dependent on one another. Thus, a generated cascode control voltage need not necessarily depend on a power supply voltage generated in parallel to the cascode control voltage. However, in some implementations, some input parameters that are generated in parallel may depend on one another. Once the input parameter control signals are generated, the PTL 400 may pass the control signals to corresponding outputs (410). Responsive to the control signals, the amplifier system may adjust the controlled input parameters (412). For example, the example MS amplifier circuitry 200, 300 may activate a selected number of amplifier fingers or adjust a cascode bias level.

Amplifier Calibration

Figure 5:
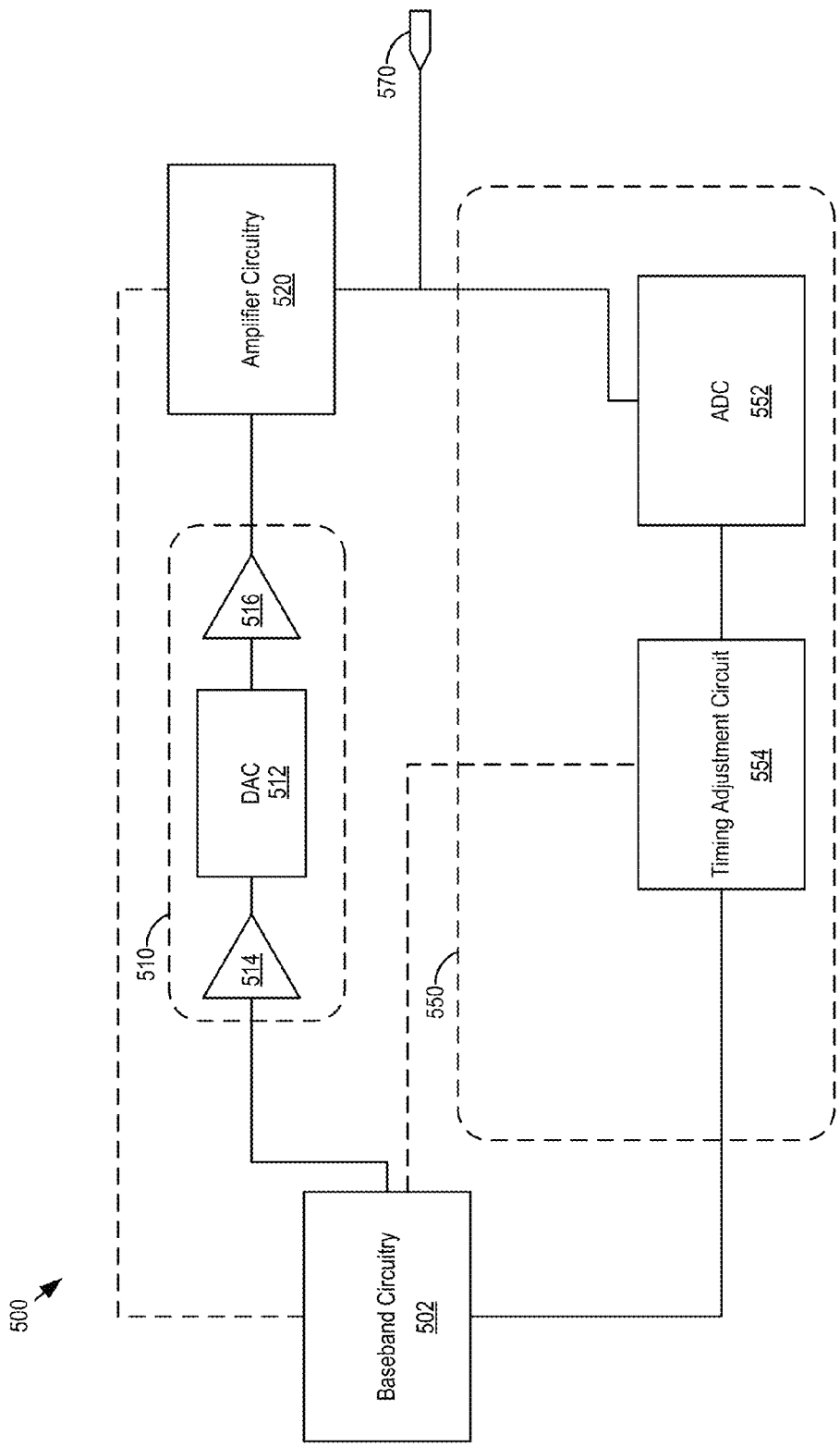
FIG. 5 shows example transmission circuitry.

FIG. 5 shows example transmission circuitry 500 which implements an MS amplifier. The example transmission circuitry 500 may include baseband circuitry 502, a DAC path 510, an amplifier circuitry 520, a feedback path 550, and output 570. The DAC path 510 may include a DAC 512 and amplifiers 514, 516. The amplifiers 514, 516 may be placed before and after the DAC 512 and may act on digital domain or analog domain signals depending on their position relative to the DAC 512. For example, amplifier 514 may provide digital gain, while amplifier 516 provides analog signal gain.

The amplifier circuitry 520 may adjust input parameters based on received MS information from the baseband circuitry 502. However, as discussed below, during calibration, the amplifier circuitry 520 may adjust input parameters independently of the MS information to correlate input parameters with output parameters. Thus, facilitating determination of desired input parameters for particular MS information inputs. The amplifier circuitry 520 may include circuitry as discussed above with respect to example MS amplifier circuitry 200, 300.

The feedback path 550 may be coupled to the output 570. The feedback path may include an analog-to-digital converter (ADC) 552 to convert the output signal back into a digital baseband signal. The feedback path 550 may further include a timing adjustment circuit 554, which may be used to align MS parameter adjustment timing with that of the digital baseband signal. The feedback path provides the feedback to the baseband circuitry 502 for feedback analysis. For example, the baseband circuitry 502 may use the feedback signal to determine the current gain of the system. Additionally or alternatively, the baseband circuitry 502 may perform other analyses such as amplifier efficiency calculations and pre-distortion calibration.

The feedback path 550 may be used by the baseband circuitry 502 to monitor output parameters of the example transmission circuitry 500. The baseband circuitry 502 may correlate the monitored output parameters with input parameters from the amplifier circuitry 520. The correlated input parameters and output parameters may be used to calibrate the amplifier circuitry 520.

Figure 6:
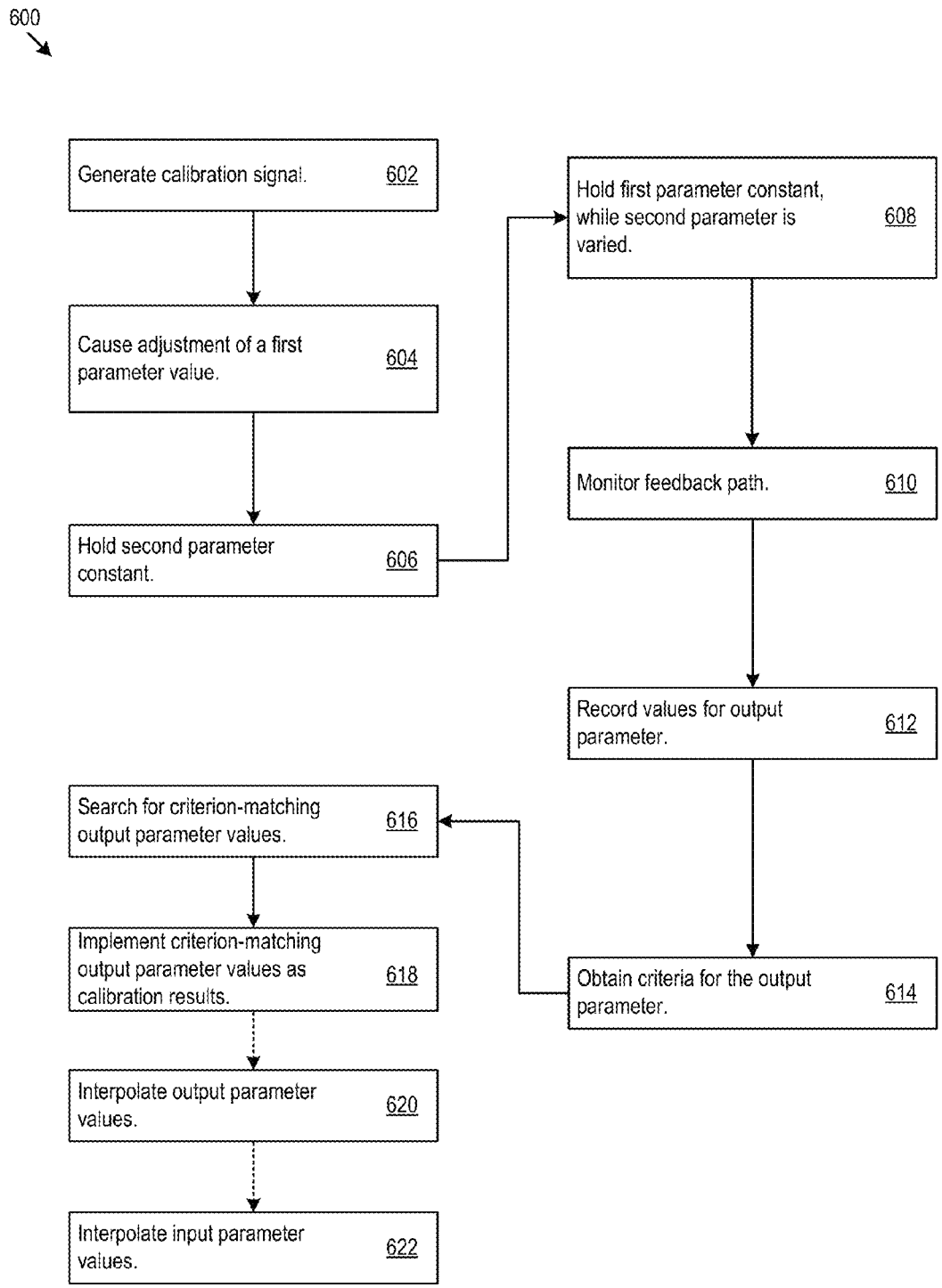
FIG. 6 shows example calibration logic.

Referring now to FIG. 6, an operational flow diagram of example calibration logic 600 is shown. In various implementations, the example calibration logic 600 may be implemented on circuitry. The baseband circuitry 502 may generate a calibration signal for the amplifier circuitry 520 (602) as RFin on the input 202. In addition, the baseband circuitry 502 may cause adjustment of a value of a first input parameter for the amplifier circuitry 520 (604). For example, the baseband circuitry 502 may ramp up the amplitude of the calibration signal. The baseband circuitry may ramp up the amplitude of the calibration signal by providing a calibration signal of discrete blocks of complex sinusoid signals with multiple distinct power levels. Similarly, the baseband circuitry 502 may ramp down the amplitude of the calibration signal. Further, the baseband circuitry 502 may progress through multiple amplitude levels of the calibration signal in an order not necessarily progressing from high to low amplitude or low to high amplitude. Additionally or alternatively, the baseband circuitry 502 may vary another input parameter, such as, the supply voltage, the cascode bias level, the number of active amplifier fingers, or another input parameter to serve as the first input parameter.

Figure 7:
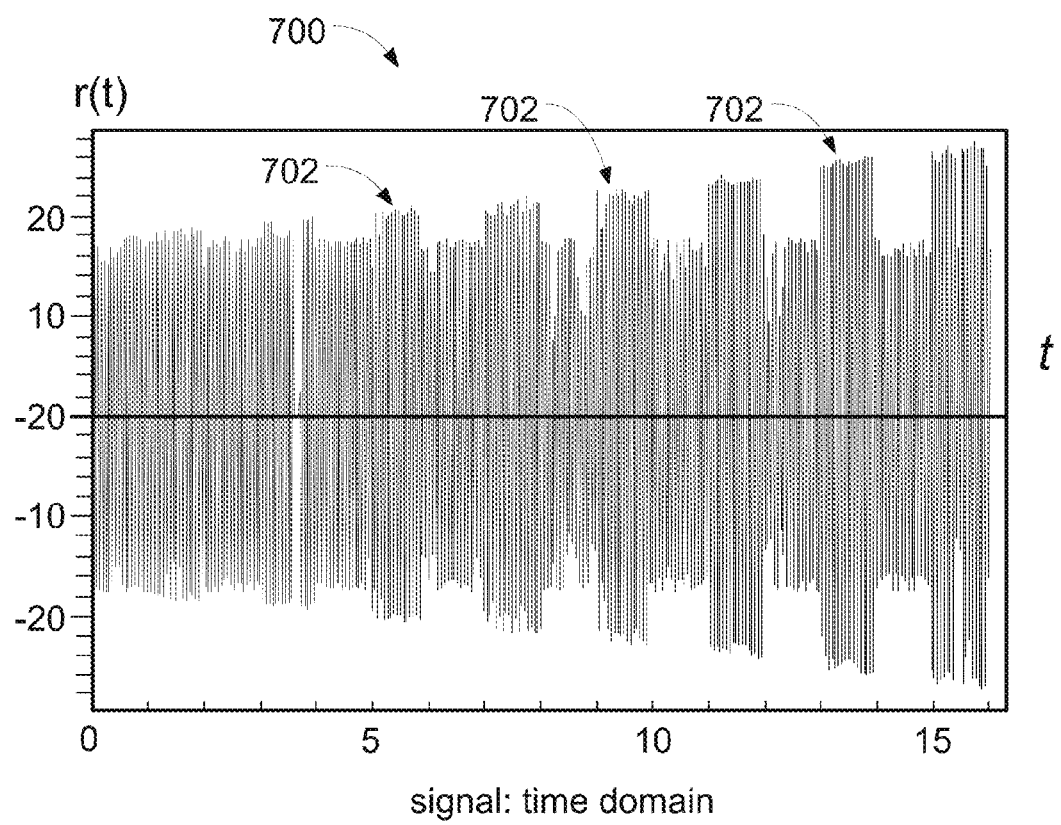
FIG. 7 shows an example amplitude ramping calibration signal.

FIG. 7 shows an example amplitude ramping calibration signal 700. The example amplitude ramping calibration signal 700 includes multiple discrete blocks 702 of complex oscillating, for example sinusoidal, waveforms with different amplitude levels. The example amplitude ramping calibration signal 700 may be provided as the RFin input on the input 202 to the amplifier circuitry 520 by the baseband circuitry 502 during calibration. The example amplitude ramping calibration signal 700 may be repeated for multiple values of a given input parameter, for example, the cascode bias level, the number of active amplifier ingers, the power supply voltage, or other input parameters, to determine the effect of the input parameter on a monitored output parameter for varying input signal RFin amplitudes. The example amplitude ramping calibration signal 700 may include tones, stochastic modulated data, or other signals.

Returning to the discussion of FIG. 6, the baseband circuitry 502 may hold a second input parameter constant while the first input parameter is varied (606). For example, the baseband circuitry 502 may cause the amplifier circuitry 520 to hold the power supply voltage constant while the amplitude of the input signal, such as the cascode bias level, or the number of active amplifier fingers is varied. The baseband circuitry 502 may hold the first input parameter constant while the second input parameter is varied (608).

The baseband circuitry 502 may monitor the feedback path 550 for the multiple values of the first and second input parameters (610). The baseband circuitry 502 may record a set of values of an output parameter for the multiple values of the first and second input parameters (612). For example, the baseband circuitry may monitor the gain of the system as the selected output parameter. In the example, the first and second input parameters may be input signal amplitude, RFin, and the cascode bias level. The baseband circuitry 502 may record the gain value and then store the gain value in memory using the first and second input parameter values as indices for the stored gain value. Thus, a triad of values may be associated with each stored gain value. From a given entry, the baseband circuitry may then determine cascode bias level that produces a particular gain for a particular input signal amplitude.

The baseband circuitry 502 may obtain one or more criteria for the output parameter (614). For example, the baseband circuitry 502 may access a stored criterion for an output parameter. Alternatively or additionally, the baseband circuitry may determine the criteria dynamically based on operating conditions. For example, the criteria may be based on device battery level, transmission signal quality indicators, closed-loop power control instructions or other operating conditions. Additionally or alternatively, the criteria may include criterion for input parameters. For example, the criterion may direct selection to the highest efficiency achieved with a power supply voltage below a given threshold.

Once the set of output parameter values is stored, the baseband circuitry 502 may search the set of output parameters for criterion-matching output parameter values that meet the criterion (616). Once the criterion-matching output parameter values are determined, the baseband circuitry 502 may implement the criterion-matching output parameters as the calibration results (618). For example, the baseband circuitry 502 may use the input parameters values and RFin values that correspond to the criterion-matching output parameters to populate the entries of LUT circuitry, such as the LUT circuitry discussed above with respect to example MS amplifier circuitry 200, 300. Additionally or alternatively, the input parameters values that correspond to the criterion-matching output parameter values may be used as entries for a shaping table for a MS. In some cases, the criterion-matching output values may be interpolated to determine intermediate output parameter values between the discrete values found via the calibration (620). Similarly, input parameter values corresponding the criterion-matching output values may be interpolated to obtain intermediate input parameter values (622).

Figure 8:
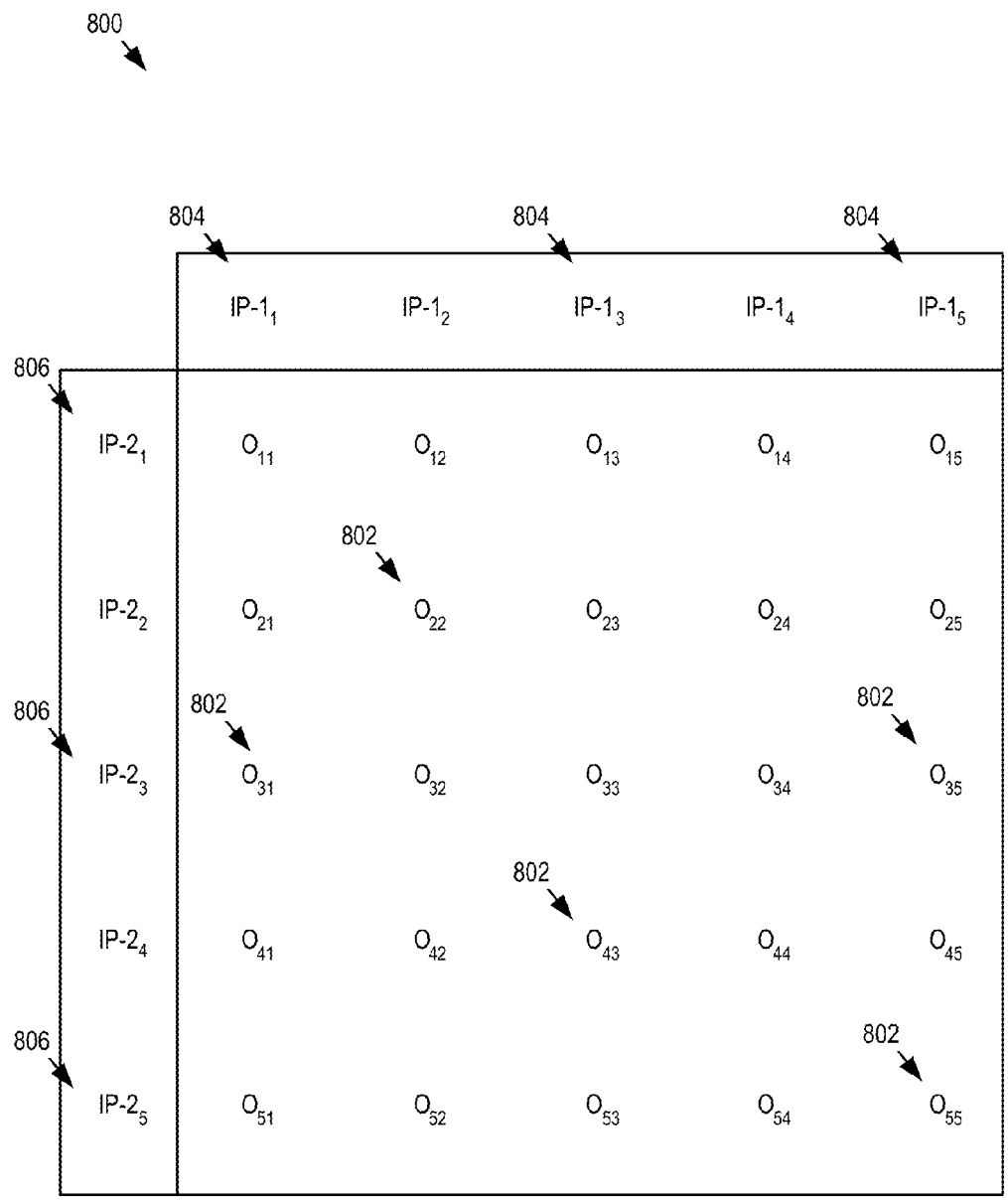
FIG. 8 shows an example two-dimensional logical memory array.

The baseband circuitry 502 may store the recorded output parameter values in the LUT in virtually any memory format. For example, the baseband circuitry 502 may store the recorded output parameter values in memory logically mapped by a multi-dimensional index using the input parameter values as the indices. FIG. 8 shows an example two-dimensional logical memory array (LMA) 800. In the example LMA 800, values 802 for the example output parameter (O), are indexed according to values 804, 806 of example input parameters (IP-1, IP-2). For example, IP-1 may include input signal (RFin) amplitude and IP-2 may include power supply voltage. Each recorded output parameter value 802 may be accessed by referencing the corresponding input parameter values 804, 806. Additionally or alternatively, the output parameter values 802 may be accessed by searching the output parameter values themselves. For example, the output parameter values may be searched for criterion-matching output parameter values, as discussed above. In some cases, the recorded values may be stored in content addressable memory to facilitate criterion-matching searches.

Figure 13:
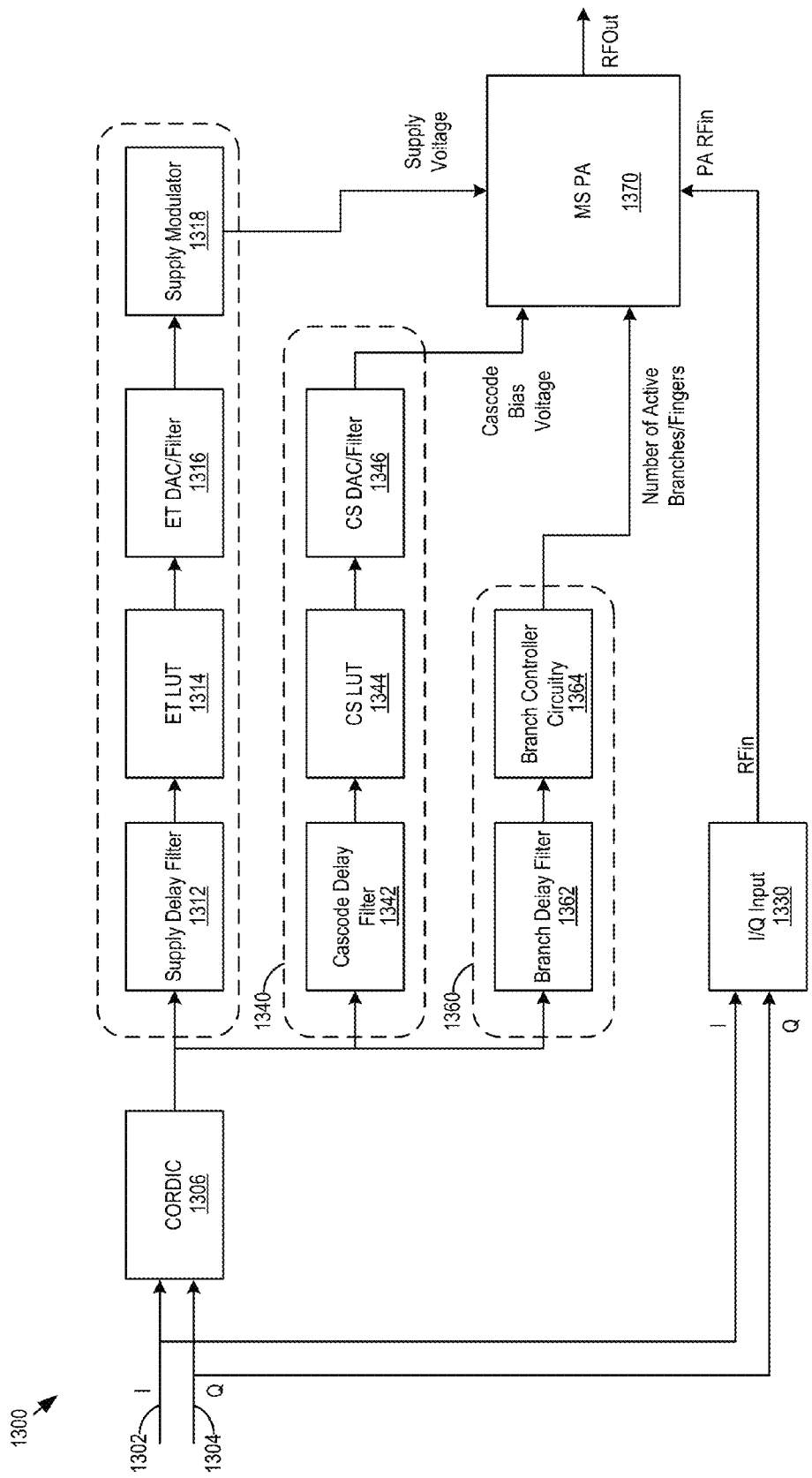
FIG. 13 shows second example amplifier circuitry.

FIG. 13 shows second example amplifier circuitry 1300. The second example amplifier circuitry 1300 may include two arms 1340, 1360 for control of the cascode bias of the MS PA 1370 and the activation states of the MS PA 1370 fingers or branches. The second example amplifier circuitry 1300 may further include two arms 1310, 1330 for supply modulation control (in this example, envelop-tracking supply modulation control) and I/Q input to the MS PA 1370.

The I/Q inputs 1302, 1304 to the system may be fed into the I/Q input arm 1330 and a coordinate rotation digital computer (CORDIC) 1306. The I/Q input arm may include DAC and RF upconversion circuitry to convert the I/Q signals into RF input for the MS PA 1370.

The output of the CORDIC 1306 may be split and provided to the other three arms 1310, 1340, 1360.

The supply modulation control arm 1310 may include a MS delay filter 1312 for timing synchronization with RFin, an ET LUT 1314 for look-up of envelope shaping parameters for various values of RFin, ET DAC and filter circuitry 1316 for generation of an ET signal, and a supply modulator 1318 to vary the MS voltage of the MS PA 1370.

The cascode bias control arm 1340 may include a cascode delay filter 1342 for timing synchronization with RFin, an cascode shaping (CS) LUT 1344 for look-up of cascode shaping parameters for various values of RFin, and CS DAC and filter circuitry 1346 for parallel generation of a cascode gate bias.

The branch control arm 1360 may include a branch delay filter 1362 for timing synchronization with RFin and branch controller circuitry 1364 to control the number of active PA branches/fingers responsive to the I/Q input signals.

Supply modulation may save power by reducing the supply voltage of a PA during period where the output of the PA is less than peak output. However, modulating the supply voltage may have smaller magnitude effect on the current consumption of the PA. For example, the effect on current consumption may be a second or higher order effect. In some cases, tandem power savings may be achieved by modulating the current consumption of the PA, for example, by switching on and off PA branches.

Efficiency may be a function of supply voltage and current. In some cases efficiency may be estimated using the relation:

$$\text{Efficiency} \propto \frac{V_{out} \cdot I_{out}}{Vdd \cdot I_Q},$$

where $V_{out}$ and $I_{out}$ are the output voltage and current delivered by the PA to the load, Vdd is the power supply voltage, and $I_Q$ is the quiescent current of the PA.

For an ideal Class A power amplifier, as an example, at peak output power, $V_{out}$=Vdd and $I_{out}$=$I_Q$/2. Hence, in some cases, the maximum efficiency of an ideal Class A PA is 50%. As the output PA deviates from its peak, Psat, which may occur for high PAPR signals, $V_{out}$ and $I_{out}$ reduce from their peak values. In a PA with fixed quiescent current and fixed supply voltage, Vdd and $I_Q$ are constant. Hence, the efficiency of the PA may vary proportionally to the output power. Some supply modulation schemes, such as envelope tracking, may boost the efficiency by making Vdd track $V_{out}$. Additionally or alternatively, efficiency increases may be realized if $I_Q$ tracks $I_{out}$.

In various implementations, the quiescent current of the PA may be varied simultaneously with supply voltage modulation. As discussed above, a PA may be split into N branches. The branches may be segmented in a binary fashion with equal branches. Additionally or alternatively, the PA braches may be split such that the differing branches have different dynamic ranges, similar to a thermometer system. In an example scenario, when the PA is transmitting peak output power, all N branches of the PA may be activated such that the quiescent current of the PA is highest and the supply voltage of the PA is at its maximum. As the output of the PA decreases from the peak output power, the supply voltage of the PA may be reduced by the supply modulator. In the example scenario, controller circuitry may adjust the number of active branches in the power amplifier to allow the current to dynamically track the envelope information. In some cases, the bias point of the active elements of the PAs may remain unchanged by this ET branch modulation scheme. Accordingly, the linearity of the PA may be similar to fixed branch operation. The control circuitry may receive its input from either an analog or a digital supply modulation control source. Systems that control the number of active supply branches or fingers may be used for both static and dynamic MS systems.

However, in various implementations output parameters other than efficiency may be used to guide PA operation. For example, amplifier phase or amplifier gain may be used in addition to or in place of efficiency. In an example scenario, an MS PA may be configured to have fixed phase or fixed gain with regard to input signal level.

Figure 9:
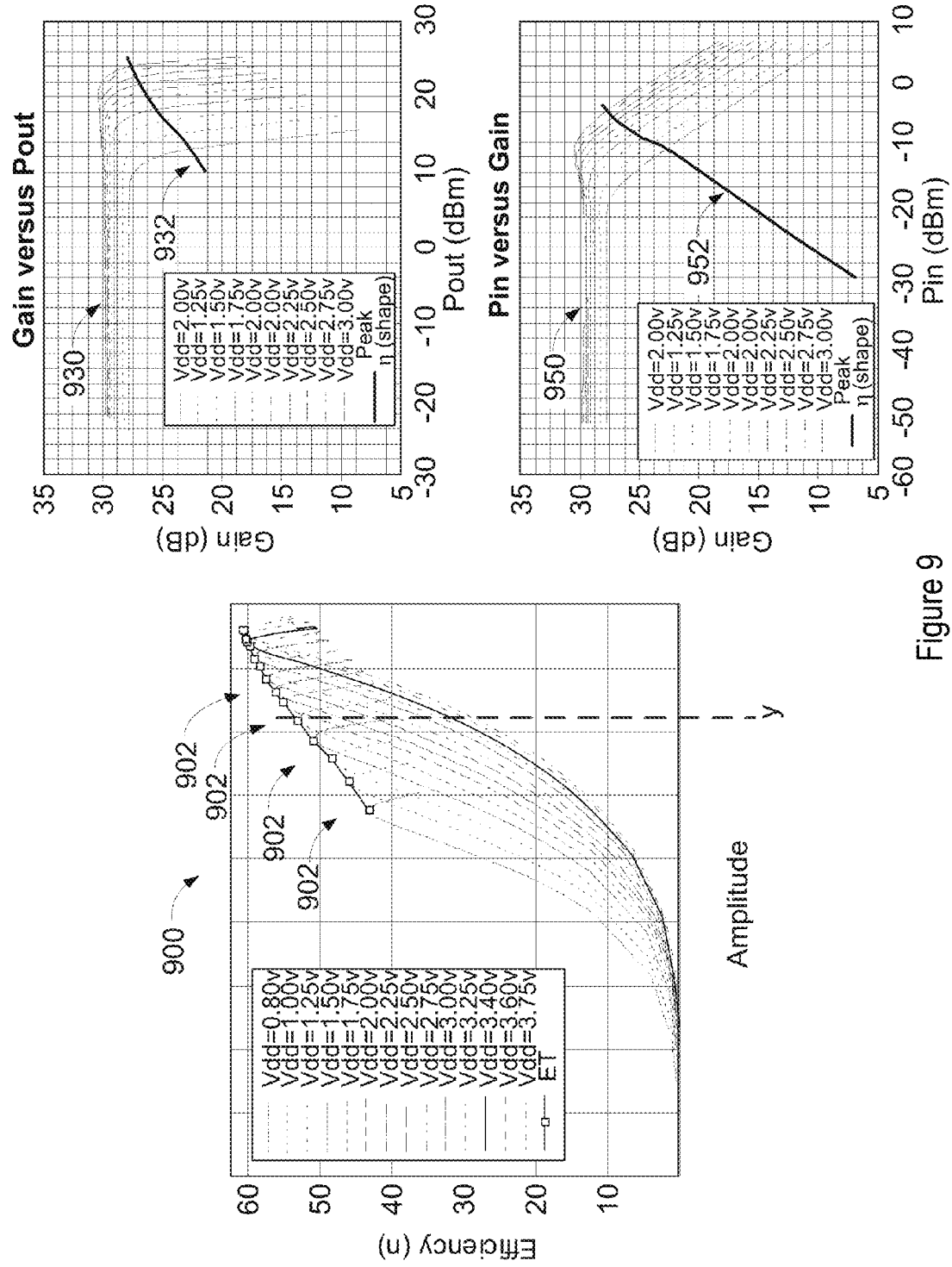
FIG. 9 shows example plots of recorded amplifier efficiency versus input signal amplitude.

FIG. 9 shows example plots 900, 930, 930 of recorded amplifier variables. Plots 900 shows efficiency (η) versus input signal amplitude of RFin for multiple input parameter values, which in this example are power supply voltage values (Vdd). The plots 900 show efficiency peaks 902 for the various power supply voltage values. The efficiency peaks 902 may be selected by the calibration logic 600, in some cases, when an efficiency criterion is implemented. For example, for a given amplitude "y", a query such as, max[efficiency, y], may return one of the efficiency peaks 904, because the peak 904 corresponds to the highest efficiency for the corresponding input amplitude, y of RFin. Plots 930 shows gain versus output power for various power supply voltage values. The line 932 shows the points of peak efficiency for the various power outputs. Plots 950 shows gain versus input signal power for various power supply voltage values. The line 952 shows the points of peak efficiency for the various input signal powers.

Figure 16:
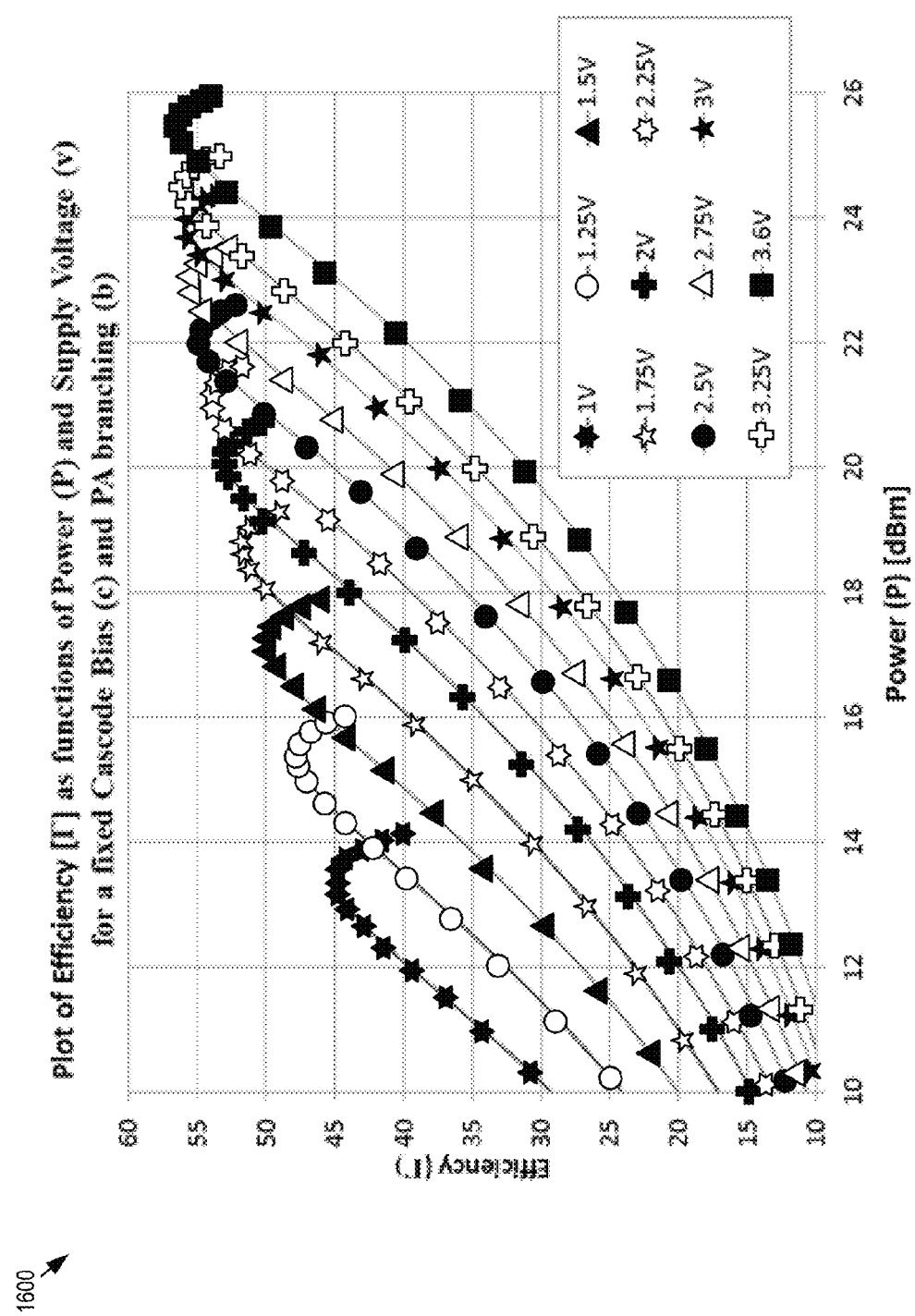
FIG. 16 shows another example plot of efficiency versus input signal power of RFin for multiple input parameter values.

FIG. 16 shows another example plot 1600 of efficiency versus input signal power of RFin for multiple input parameter values.

Figure 10:
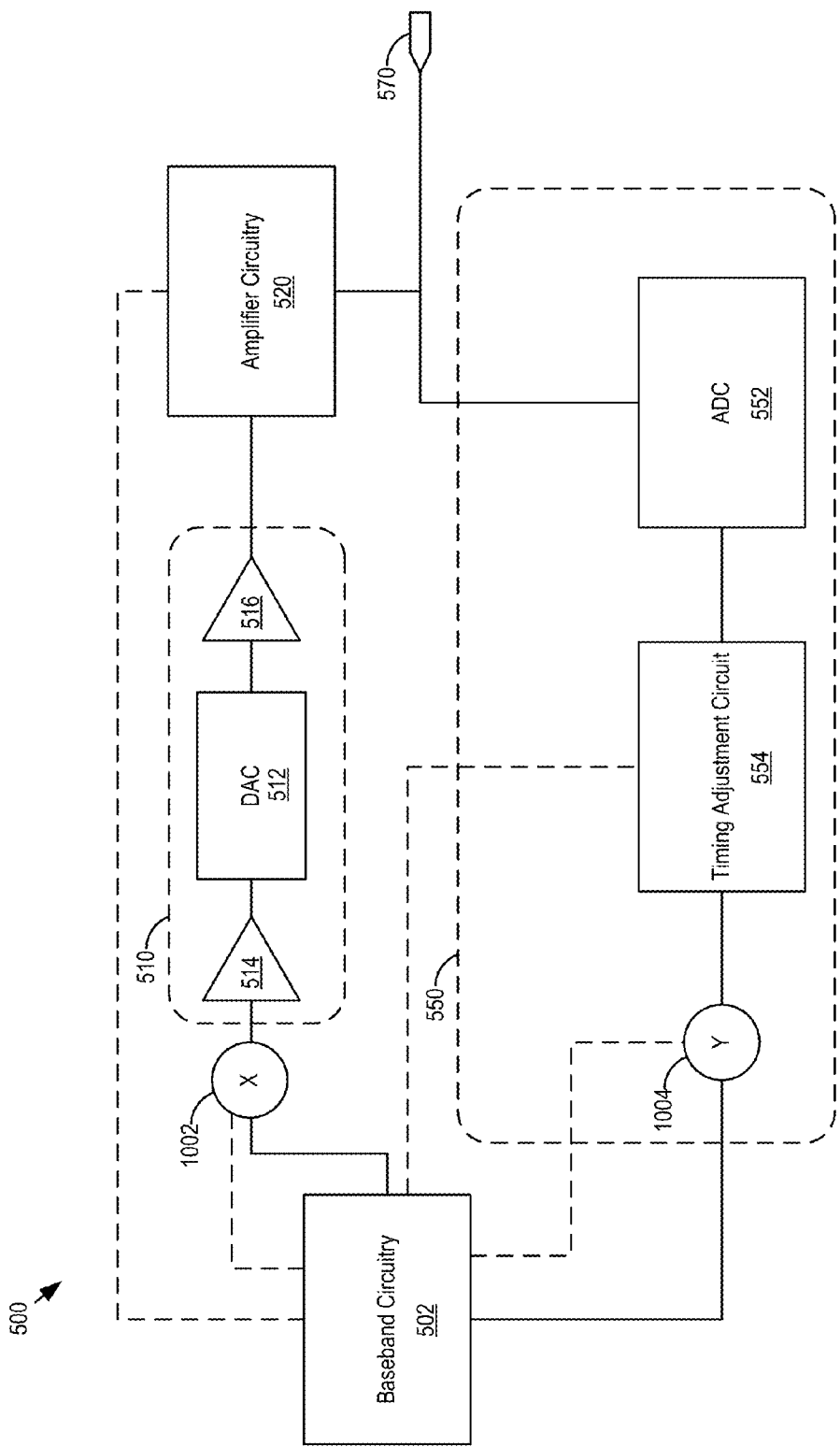
FIG. 10 shows the example transmission circuitry with monitoring points.

The baseband circuitry may and compute and monitor output values such as, gain, efficiency, or other output values. To compute these values, the baseband circuitry 502 may monitor a signal at one or more points along its progression to the output 570. FIG. 10 shows the example transmission circuitry 500 with monitoring points 1002, 1004. Thus, in addition to monitoring the input signal RFin at the input 202, intermediate input signals may be monitored along the signal path between the input 202 and the output 204. Monitoring points 1002, 1004 may include voltage sampling circuitry, current sampling circuitry, or other sampling circuitry. Monitoring point 1002 may determine parameter values, X, for the input signal Y at that particular input point or location. Baseband circuitry 502 may determine input parameter values based on the input signal at the monitoring point 1004 to achieve a desired output for the signal at output RFout by sampling the feedback path 550. In one example computation, the baseband circuitry 502 may determine the output parameter, gain, by computing Y/X. Similarly, efficiency may be computed by comparing the computed gain to the power supply voltage level, cascode bias, or other source of energy consumption. The efficiency, η, may be calculated by taking the ratio of the output power to the power drawn from the power source of the amplifier. For example, n may be calculated by measuring the output power at output 204 and Vdd and current (I) at the supply input 248. The efficiency may then be computed as:

$$\eta = \frac{P_{out}}{Vdd \cdot I}$$

The baseband circuitry 502 may also perform a timing calibration to ensure that the input parameter adjustments applied by the MS amplifier 520 are synchronized to the input signal. Timing adjustment circuit 554 may include a filter to delay the input signal or the MS adjustment of the amplifier circuitry 520 to synchronize the input parameter adjustments to the input signal. The synchronization process may be applied iteratively. It may be implemented through digital filtering which may have a register that have filtering parameters loaded through an iterative software routine. Additionally or alternatively, dedicated circuitry may be used to compute the load values.

In an example scenario, calibration for a MS PA implementing cascode voltage modulation and branch/finger activation state control may be performed as in an example three-part calibration sequence discussed below. The three parts may include setup, training signal analysis, and calibration execution.

Setup may include placing the MS PA system in a supply modulation mode. That is, all the switches and related circuitry are turned on such that, the signal distributes the complex baseband across the control arms of the amplifier circuitry, for example as discussed above with respect to second example amplifier circuitry 1300.

The signals split between the CORDIC and the IQ input arm may be recombined at the MS PA.

In the example scenario, the calibration signal may include a complex sinusoidal signal of a given frequency and fixed duration, BlockLength (for example, Block-Length=100 nanoseconds). Each BlockLength may have fixed amplitude, which is proportional to its power. In this example scenario, the peak to average ratio of the signal may be 1 within each given block. Accordingly, the instantaneous power and average power (in each BlockLength) may be the same.

In the example scenario, several such BlockLength of signals (total of L blocks) may be augmented such that, the power from one to the next is changed such that the signal power (when expressed in dB scale) in i+1th block P(i+1) =P(i)+DeltaP, where DeltaP is the incremental power in dB (example, DeltaP=0.5 dB). Accordingly, the training signal may cover a group of signal blocks whose power spans from Pmin to Pmax, where Pmax−Pmin=M*DeltaP.

Figure 14:
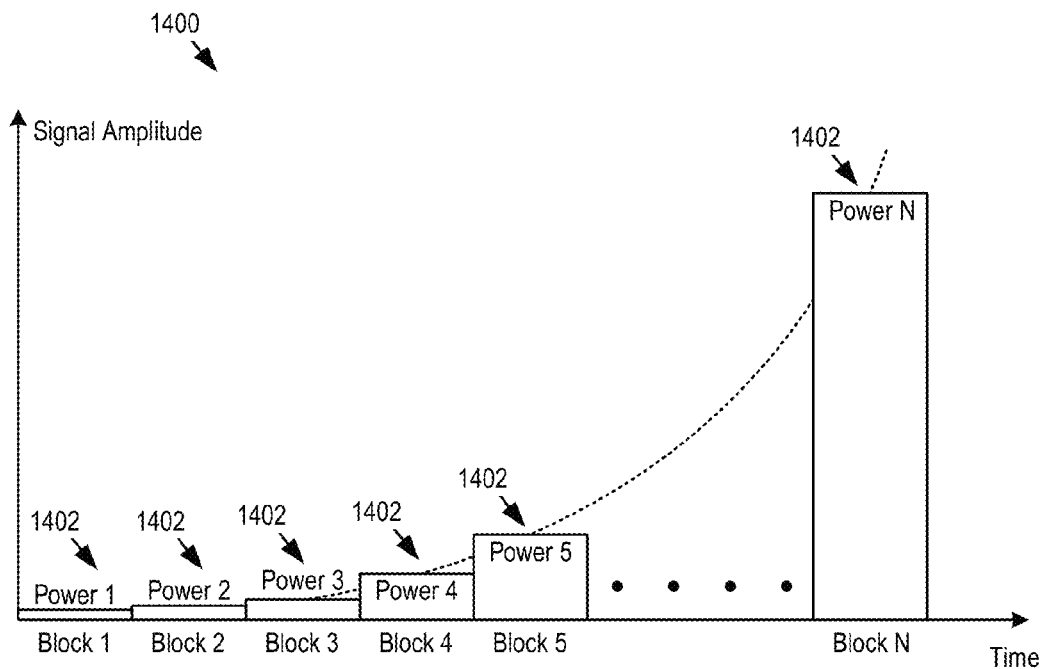
FIG. 14 shows a plot 1400 of an example calibration signal.

FIG. 14 shows a plot 1400 of the example calibration signal from the example scenario. The signal blocks 1402 are ordered such that the power of the calibration signal increases with time.

However, in other scenarios, the order of the blocks may be varied. For example the blocks may progress in order of decreasing power, randomly in power, or in another order covering the selected blocks. In some cases, randomizing the block order may reduce interference effects generated via the calibration signal. However, in some cases, using an order the progresses in signal power may simplify peak detection algorithms relative to randomized orders.

Figure 15:
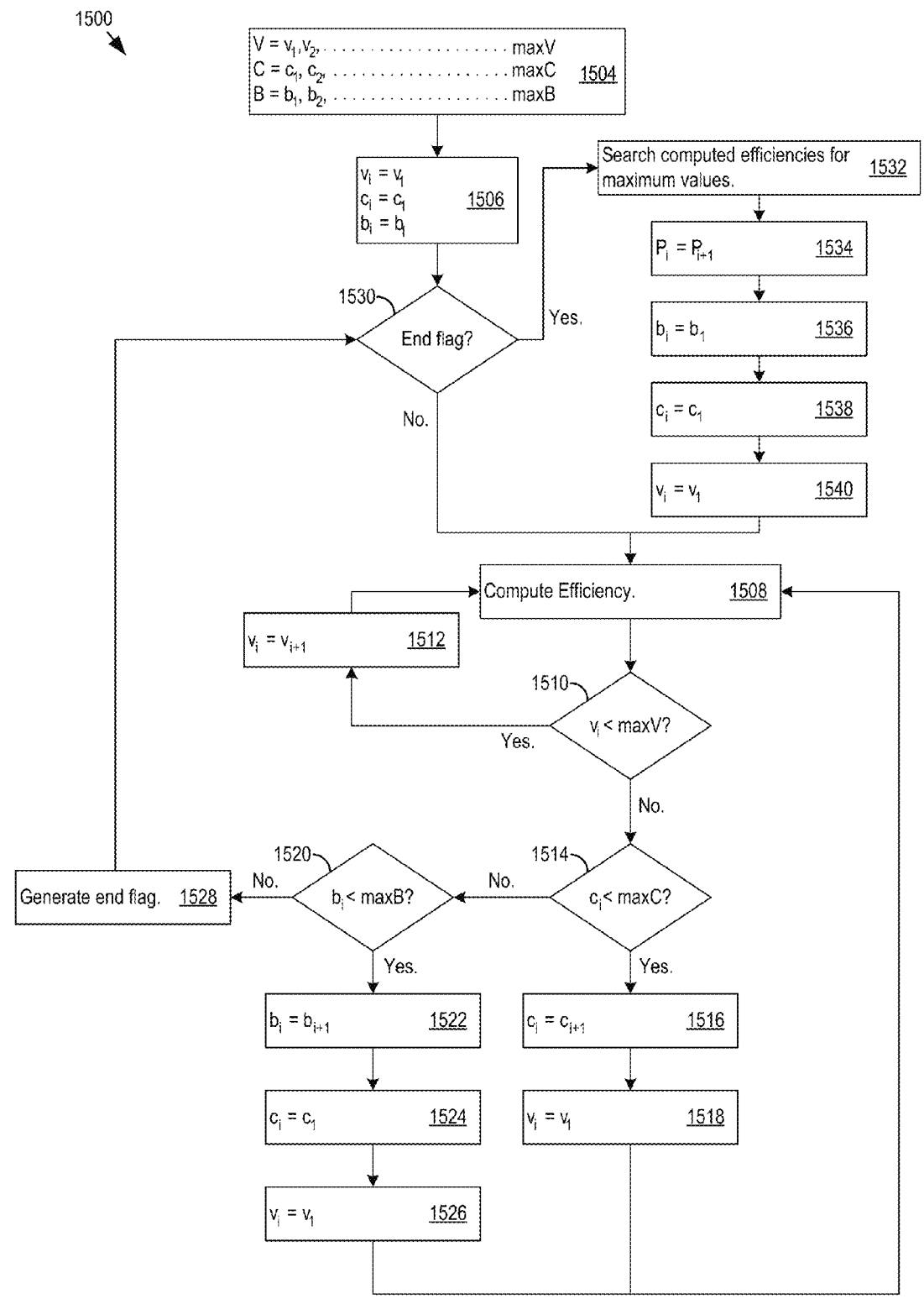
FIG. 15 shows an example operational flow diagram of second example calibration logic.

FIG. 15 shows an example operational flow diagram of second example calibration logic 1500. The second example calibration logic 1500 may be implemented in scenarios, such as the example scenario discussed above, where cascode voltage modulation and branch/finger activation state control are implemented.

The second example calibration logic 1500 may operate to select a set of operational values that produce a greater efficiency value than other combinations of operational values. However, the second example calibration logic 1500 may be adapted to perform searches using metrics other than efficiency. For example, the second example calibration logic 1500 may also be used to search for specified gain values in the output, for example to determine values that achieve fixed gain for different inputs.

The second example calibration logic 1500 may define an input parameter vector including components: V (MS supply voltage), C (cascode voltage), B (number of active branches).

The second example calibration logic 1500 may define allowed levels (i=1, 2, . . . maxValue) for the vector components (1504).

The second example calibration logic 1500 may initialize the vector components such that i=1 for each of the components (1506).

The second example calibration logic 1500 may compute the efficiency value for the current vector components (1508). The second example calibration logic 1500 may determine whether the voltage component level is at maxV (1510). If the voltage component level is not at maxV, the second example calibration logic 1500 may increment the voltage component (1512) and return to compute the efficiency value for the current vector components (1508).

If the voltage component level is at maxV, the second example calibration logic 1500 may determine whether the cascode voltage component level is at maxC (1514). If the cascode voltage component level is not at maxC, the second example calibration logic 1500 may increment the cascode voltage component (1516), initialize the voltage component (1518), and return to compute the efficiency value for the current vector components (1508).

If the cascode voltage component level is at maxC, the second example calibration logic 1500 may determine whether the number of active branches is at maxB (1520). If the number of active branches is not at maxB, the second example calibration logic 1500 may increment the number of active branches component (1522), initialize the cascode voltage component (1524), initialize the voltage component (1526), and return to compute the efficiency value for the current vector components (1508).

If the number of active branches is at maxB, the second example calibration logic 1500 may generate an end flag (1528).

The second example calibration logic 1500, may check for an end flag (1530). If an end flag is present, the may search the computed efficiency values for the maximum value (1532), and increment the calibration signal power (P) (1534). The second example calibration logic 1500 may initialize the number of active branches component (1536), initialize the cascode voltage component (1538), initialize the voltage component (1540), and return to compute the efficiency value for the current vector components (1508). The second example calibration logic 1500 may perform the efficiency computations and search for each block of the calibration signal.

Figure 11:
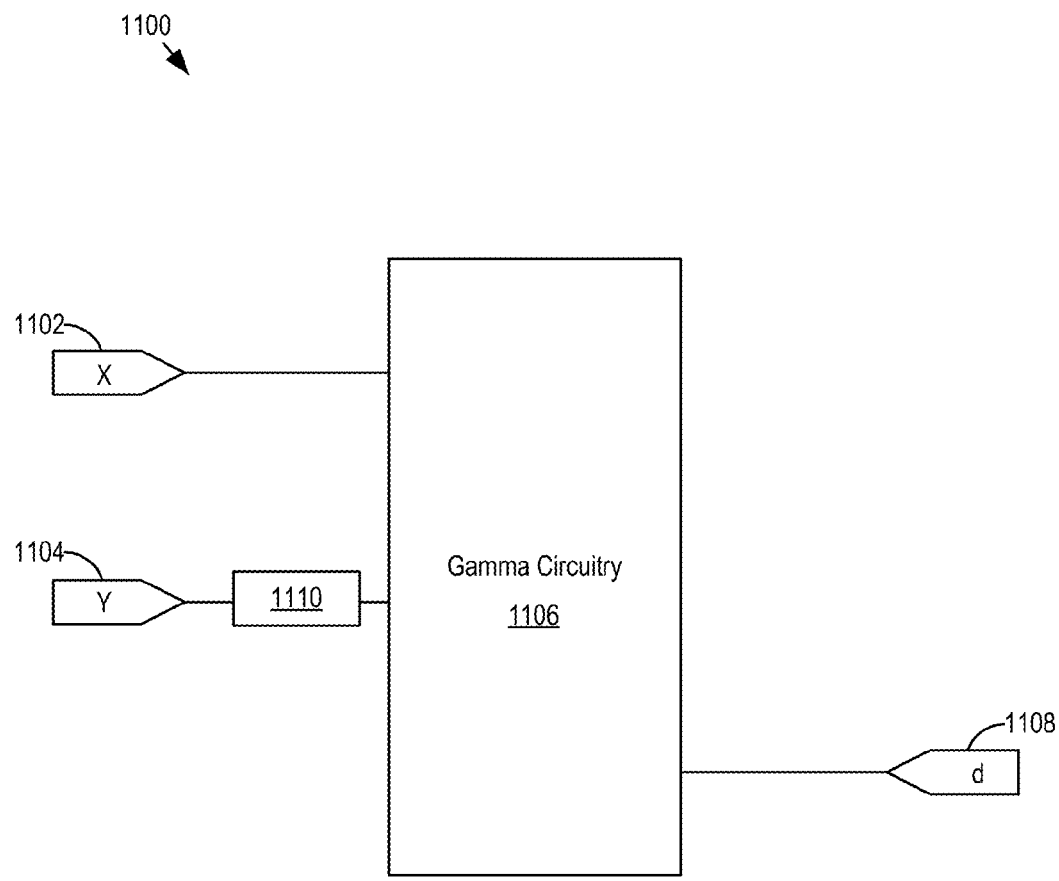
FIG. 11 shows an example timing adjustment circuit.

FIG. 11 shows an example timing adjustment circuit 1100. The example timing adjustment circuit 1100 may receive the sampled values of X and Y as inputs 1102, 1104, where X comprises a time series vector, $(x_1, x_2, \ldots, x_n)$, and Y is a time series vector, $(y_1, y_2, \ldots, y_n)$. The gamma circuitry 1106 may apply a timing criterion, $\Gamma$, to X and Y to determine the delay, d, that may be applied to synchronize the input, such as RFin and MS tracking portions of the transmission circuitry 500. Thus, the gamma circuitry 106 simulates the processing delays in measuring the envelop of the input signal RFin, identifying an input parameter to obtain a desired output RFout based on the measured input signal RFin, and implementing the identified input parameter on the input signal RFin. The variable test delay for calibration is provided at filter 1110 to delay the Y input (RFin). The gamma circuitry may provide an indicator of the delay, d, at output 1108. In some cases, the selected d may be the delay value that meets a defined criterion for $\Gamma$. For example, the selected d may produce a maximum value of $\Gamma$ or a value above or below a threshold.

In some implementations, $\Gamma_N$, a cross-correlation of X and Y, may be used as the criterion, where:

$$\Gamma_N = 1 - \frac{\det <X, Y>}{\prod_{i=1}^{N} \sigma_i^2}$$

Where $\sigma$ is the standard deviation of RFout. In some cases, $\sigma$ may be calculated as the square root of the variance of the output signal. The variance may be used as an approximation of the signal to distortion ratio or signal to noise ratio. $\Gamma_N$ may be used in cases where the power supply voltage is held fixed, low dropout transistors are used, or in other cases with Gaussian distributed noise profiles, for example.

Additionally or alternatively, other timing criteria may be used. For example, additional correction terms may be added to the timing criterion, $\Gamma$. For example systems with non-fixed MS voltages or other cases with other cases with non-Gaussian distributed noise profiles, $\Gamma_N$ may be applied, where:

$$\Gamma'_N = \Gamma_N - \frac{1}{N} \sum \ln \sqrt{\alpha (x^T R^{-1} x)}$$

Where $\alpha$ is a weighting and skew factor that may be adjusted to match empirical results; and $R^{-1}$ is the inverse of the covariance matrix for vectors X and Y, discussed above. In MS systems the noise profile may be skewed towards more noise at higher power outputs, for example.

The methods, devices, processing, circuitry, and logic described above may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (for example, database records), objects, and implicit storage mechanisms. Instructions may form parts (for example, subroutines or other code sections) of a single program, may form multiple separate programs, may be distributed across multiple memories and processors, and may be implemented in many different ways. Example implementations include standalone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

Various implementations have been specifically described. However, many other implementations are also possible.

What is claimed is:

1. A device comprising:
a modulated supply (MS) power amplifier;
a MS output configured to provide a MS voltage that is dynamically varied responsive to MS information indicative of an envelope of an input signal to the MS power amplifier; and
a cascode control output configured to provide a cascode gate voltage that is dynamically varied responsive to the MS information, the cascode gate voltage generated in parallel to the MS voltage,
wherein the MS power amplifier comprises:
a power amplifier supply input configured to receive the MS voltage from the MS output; and
a cascode gate input configured to receive the cascode gate voltage from the cascode control output.

2. The device of claim 1, further comprising multiple power supply fingers coupled in parallel to the power amplifier supply input and the cascode gate input.

3. The device of claim 2, further comprising control circuitry configured to:
obtain the MS information; and
responsive to the MS information, dynamically set an activity state of at least one of the multiple power supply fingers.

4. The device of claim 1, further comprising a digital-to-analog converter (DAC) coupled to the cascode control output, the DAC configured to generate the cascode gate voltage responsive to the MS information.

5. The device of claim 1, further comprising:
a power supply digital-to-analog converter (DAC) configured to generate a power supply (PS) voltage responsive to a PS look-up table (LUT) value;
a cascode control DAC configured to generate the cascode gate voltage responsive to a cascode LUT value; and
look up table (LUT) circuitry configured to:
obtain the MS information;
responsive to the MS information, access a LUT entry in memory of the LUT circuitry; and
responsive to the LUT entry, output the PS LUT value, the cascode LUT value or both.

6. The device of claim 5, wherein a calibration logic is configured to:
obtain output values of an output parameter for multiple input values of a first input parameter and multiple input values of a second input parameter;
responsive to a criterion, search the output values for criterion-matching output values; and
responsive to the criterion-matching output values, populate LUT entries of the memory of the LUT circuitry with corresponding values for the first and second input parameters.

7. A device comprising:
a modulated supply (MS) power amplifier comprising:
a voltage supply input; and
multiple power amplifier fingers coupled to the voltage supply input;
baseband circuitry configured to generate MS information indicative of a time-varying voltage level at the voltage supply input; and
MS control circuitry in data communication with the baseband circuitry, the MS control circuitry configured to:
receive the MS information from the baseband circuitry; and
responsive to the MS information, dynamically activate a selected number of the multiple power amplifier fingers.

8. The device of claim 7, wherein the multiple power amplifier fingers are coupled to the voltage supply input in parallel to one another.

9. The device of claim 7, wherein the MS control circuitry is further configured to dynamically deactivate a selected number of the multiple power amplifier fingers responsive to the MS information.

10. The device of claim 7, wherein:
the MS power amplifier further comprises a cascode gate control input; and
the MS control circuitry is further configured to:
generate a cascode gate control voltage responsive to the MS information; and
provide the cascode gate control voltage to the cascode gate control input.

11. The device of claim 10, wherein the cascode gate control input is coupled to cascode gate terminals of each of the multiple power amplifier fingers.

12. The device of claim 7, wherein the MS control circuitry is configured to dynamically increase a number of active power amplifier fingers as an amplitude level of an envelope of an input signal increases.

13. The device of claim 7, wherein the MS control circuitry is configured to dynamically decrease a number of active power amplifier fingers as an amplitude level of an envelope of an input signal decreases.

14. A method comprising:
setting a first input parameter of a modulated supply (MS) at a first value;
performing amplification of a calibration signal at a plurality of different values of a second input parameter of the MS with the first input parameter of the MS being held constant at the first value;
obtaining first output values for an output parameter of the MS at least based on the amplification of the calibration signal at the plurality of different values of the second input parameter of the MS with the first input parameter of the MS being held constant at the first value;
setting the first input parameter of the MS at a second value;
performing amplification of the calibration signal at the plurality of different values of the second input parameter of the MS with the first input parameter of the MS being held constant at the second value;
obtaining second output values for the output parameter of the MS at least based on the amplification of the calibration signal at the plurality of different values of the second input parameter of the MS with the first input parameter of the MS being held constant at the second value;
obtaining a criterion for the output parameter of the MS;
determining a criterion-matching output value by searching, from the plurality of first output values and the plurality of second output values, an output value that meets the criterion; and selecting calibration values for the first and second input parameters of the MS based at least in part on the determined criterion-matching output value.

15. The method of claim 14, further comprising storing the first and second output values as entries of a two-dimensional logical memory array.

16. The method of claim 15, wherein storing the first and second output values comprises indexing the entries according to corresponding values of the first and second input parameters for which the first and second output values were obtained.

17. The method of claim 15, wherein determining the criterion-matching output value comprises performing a search of the entries.

18. The method of claim 14, wherein:
determining the criterion-matching output value comprises determining multiple criterion-matching output values; and
interpolating between the multiple criterion-matching output values to determine another criterion-matching output value.

19. The method claim 14, wherein:
the first input parameter comprises an input supply voltage level for the MS;
the second input parameter comprises an amplitude level for the calibration signal; and
the output parameter comprises a gain for an amplifier driven by the MS.

20. The method of claim 19, wherein performing amplification of the calibration signal at the plurality of different values of the second input parameter with the first input parameter of the MS being held constant at the first value comprises ramping a power level for the calibration signal while holding the input power supply voltage level constant at the first value.

* * * * *